United States Patent
Jackson et al.

(10) Patent No.: US 9,747,976 B2
(45) Date of Patent: Aug. 29, 2017

(54) CHARGE TRAPPING MEMRISTOR (71) Applicant: Hewlett Packard Enterprise Development LP, Houston, TX (US)

(72) Inventors: Warren Jackson, San Francisco, CA (US); Gary Gibson, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/112,748

(22) PCT Filed: Jan. 30, 2014

(86) PCT No.: PCT/US2014/013938
§ 371 (c)(1),
(2) Date: Jul. 20, 2016

(87) PCT Pub. No.: WO2015/116118
PCT Pub. Date: Aug. 6, 2015

(65) Prior Publication Data
US 2016/0343430 A1    Nov. 24, 2016

(51) Int. Cl.
*G11C 11/10* (2006.01)
*G11C 13/00* (2006.01)
*H01L 45/00* (2006.01)
*G11C 16/04* (2006.01)

(52) U.S. Cl.
CPC ...... *G11C 13/0002* (2013.01); *G11C 16/0466* (2013.01); *H01L 45/10* (2013.01); *H01L 45/122* (2013.01); *H01L 45/1233* (2013.01); *H01L 45/1253* (2013.01); *H01L 45/146* (2013.01)

(58) Field of Classification Search
CPC .................................................... G11C 13/0002
USPC ........................................................ 365/148
See application file for complete search history.

(56) References Cited

U.S. PATENT DOCUMENTS

| 2002/0028541 | A1 | 3/2002 | Lee et al. |
| 2008/0090337 | A1 | 4/2008 | Williams |
| 2008/0128786 | A1 | 6/2008 | Kim et al. |
| 2010/0193762 | A1* | 8/2010 | Hsieh ............... H01L 45/085 257/4 |
| 2011/0176353 | A1* | 7/2011 | Li .................... B82Y 10/00 365/148 |

(Continued)

FOREIGN PATENT DOCUMENTS

| JP | 2013135065 A | 7/2013 |
| WO | WO-2013134757 A1 | 9/2013 |

OTHER PUBLICATIONS

International Searching Authority, The International Search Report and the Written Opinion, Jan. 27, 2015, 13 Pages.

(Continued)

*Primary Examiner* — Hoai V Ho
(74) *Attorney, Agent, or Firm* — Trenner Law Firm, LLC (57) ABSTRACT

A charge trapping memristor is disclosed. An example charge trapping memristor includes a first electrode and second electrode configured on opposite sides of a channel to generate an electric potential across the channel, and a charge barrier. The example charge trapping memristor also includes a charge trapping material configured to store and release an electric charge therein, wherein storing and releasing the electric charge changes electrical properties of the channel.

17 Claims, 11 Drawing Sheets

(56) References Cited

U.S. PATENT DOCUMENTS

2011/0228593 A1    9/2011  Strukov
2013/0234103 A1    9/2013  Yang et al.
2014/0247648 A1*   9/2014  Yoon .................. H01L 45/1253
                                                    365/148

OTHER PUBLICATIONS

Jamaa, M., et al., Fabrication of Memristors with Poly-crystalline Silicon Nanowires, IEEE Nano, 2009, 3 Pgs.
Zhou, Y., et al., Nonvolatile Multilevel Data Storage Memory Device from Controlled Ambipolar Charge Trapping Mechanism, Scientific Reports 3, 2013, 7 Pgs.

* cited by examiner

CHARGE TRAPPING MEMRISTOR

BACKGROUND

The memristor ("memory resistor") was originally envisioned in 1971 by Leon Chua. Chua started by explaining the fundamental circuit elements: the resistor, capacitor, and inductor. Chua then proved that no combination of the other fundamental circuit elements (i.e., resistors, capacitors and inductors) could duplicate the properties of a memristor. This inability to duplicate the properties of a memristor with the other passive circuit elements makes the memristor another fundamental circuit element.

In 2008, a team at Hewlett-Packard (HP) Labs published the results of an analysis of a thin film of titanium dioxide made to behave as a memristor device. HP Labs went on to create an elementary circuit model that was defined by the same mathematical equations as those predicted by Chua for the memristor. The team then showed that this simple model could reproduce a wide variety of complex current-voltage (I-V) curves. The team also showed the equations for the drift of oxygen vacancies in titanium dioxide, and their influence on the electronic conduction in the material, were also identical with an equivalent circuit model, and thus the memristor equations.

From this, it was possible to develop a formula for the memristance of a device. This memristance formula showed that the size of the most important term in the memristance equations gets larger as the device size decreases. As such, understanding memristance is even more important as the size of circuits continue to get smaller. This is particularly true when designing electronic circuits in the realm of nano-size electronics.

BRIEF DESCRIPTION OF THE DRAWINGS

FIG. 4b illustrates the corresponding band diagram taken along lines AB in FIG. 4a.

FIG. 5b illustrates the corresponding band diagram taken along lines AB in FIG. 5a.

DETAILED DESCRIPTION

A charge trapping memristor is disclosed. The charge trapping memristor exhibits properties of memristance, including a dynamic relationship between current and voltage. The most recognizable signature of a memristor is that when an AC voltage is applied to the device, the current-voltage (I-V) plot is that of a Lissajous figure (the curve formed by combining two oscillations that are perpendicular to each other). The most commonly observed I-V trace is a 'figure 8', or a 'pinched loop' for which the current is zero when the voltage is zero. The charge trapping memristor also exhibits the property of "remembering" past voltages or currents, and thus has particular application in the non-volatile memory space.

Memristors that can be fashioned into non-volatile memory devices enable greater data density than hard drives, with access times similar to dynamic random access memory (DRAM). For example, a crossbar latch implementing memristor memory can fit 100 gigabits in a square centimeter, and a scalable three dimensional design with up to 1000 layers or 1 petabit per $cm^3$. Access times can be as low as 90 nanoseconds, if not faster. This is approximately one hundred times faster than contemporaneous flash memory, while using only one percent as much energy as flash memory.

Memristor-based devices operate by the movement of atoms, ions, vacancies, and/or impurities caused by the application of current/voltage exceeding a certain magnitude to change the state of the device (write and erase processes). Once these atomic motions are completed, the device state is determined (read) at lower currents and voltages.

Moreover, atomic rearrangements typically operate by altering the tunneling and/or defect conduction, which depend exponentially on barrier thickness and defect densities. As such, memristor-based devices that rely solely on atomic motion, tend to be slow, consume a lot of energy, and are apt to be unreliable as the atoms find stable configurations.

Filaments may be used to achieve the temperatures and current densities needed to speed up these atomic motions. But filaments tend to be chaotic and unpredictable (e.g., due to the high nonlinearity introduced during the formation process).

The charge trapping memristor disclosed herein is more reliable, faster, and consumes less energy than memristor-based devices that rely strictly on atomic motions. In addition, the charge trapping memristor disclosed herein may be configured to exhibit self-limiting charging, thereby reducing overdriving, response variability, and associated damage to the device structure.

An example charge trapping memristor is a two terminal device, including a first electrode and second electrode. The electrodes are configured on opposite sides of a channel to generate an electric potential across the channel. A charge trapping material (or "charge trapping element") is configured to store and release an electric charge therein. Storing and releasing the electric charge changes electrical properties of the channel, and thus can be implemented as a faster, more reliable memory device.

An example charge trapping memristor may also include a field assistance electrode. In another example, the channel of the charge trapping memristor may be doped, e.g., to enhance an electrical field between the first and second electrodes.

The charge trapping memristor reduces or altogether eliminates strict reliance on atomic motion to change a state of the device (e.g., from a high or "1" to a low or "0" and vice versa). Instead, the state of the charge trapping memristor is based on changing the conductance of the channel by trapping electrons in the charge trapping material. This can be explained by change-of-state equations. That is, a negative charge in the charge trapping material impedes conduction of electrons by raising the electric potential in the channel. A positive charge in the charge trapping material enhances conduction of electrons in the channel by lowering the electric potential in the channel.

It is noted that the charge trapping memristor disclosed herein may he fabricated according to any of a variety of different processes. In an example, the charge trapping memristor is fabricated from the same and/or similar materials and processes used in the fabrication of traditional flash memory devices. Hence, manufacture of the charge trapping memristor is compatible with existing production technology and requires few, if any, changes to manufacturing facilities.

It is also noted that a variety of device structures are possible. In an example, the charge trapping memristor has a device structure with an insulating charge barrier between the channel and the charge trapping material. In another example, the charge trapping memristor has a device structure with charge trapping material between adjacent layers of an insulating charge barer. In another example, the charge trapping material is provided as an inclusion in the channel. The inclusion may be a semiconductor material and/or an insulating material.

Before continuing, it is noted that as used herein, the terms "includes" and "including" mean, but is not limited to, "includes" or "including" and "includes at least" or "including at least." The term "based on" means "based on" and "based at least in part on."

In theory, an ideal memristor is defined as a passive two-terminal electronic device that is built to express only the property of memristance (just as a resistor expresses resistance and an inductor expresses inductance). Another way of describing a memristor is as any passive two-terminal circuit element that maintains a functional relationship between the time integral of current (called charge) and the time integral of voltage (often called flux, as it is related to magnetic flux). The slope of this function is called the memristance M, and is similar in some regards to variable resistance.

In practice, however, it may be difficult to build a 'pure memristor,' because an actual device may have a small amount of some other property, such as capacitance (just as an actual, non-theoretical inductor also exhibits resistance). Therefore, the term "memristor" is used herein to mean any device which exhibits properties of memristance, whether a 'pure' or theoretical memristor, or an actual device at least exhibiting some properties of memristance (although the device may also exhibit some amount of capacitance, resistance and/or inductance).

The definition of a memristor is based on the fundamental circuit variables of current and voltage and associated time-integrals (e.g., like the resistor, capacitor and inductor). But unlike these other three elements, which are allowed in linear time-invariant (LTI) system theory, memristors have a dynamic function with memory and may be described as some function of net charge. As such, to date there is no such thing as a "standard" memristor. Instead, each device implements a particular function, wherein the integral of voltage determines the integral of current, and vice versa.

FIGS. 1a-d illustrate device structures of an example charge trapping memristor 100 having a charge trapping material 110. An example device structure of the charge trapping memristor 100 shown in FIGS. 1a-b includes a substrate 120, a first electrode 130, a second electrode 135, an insulator 140, and a channel 150 formed between the first and second electrodes 130 and 135.

Figure 1A:
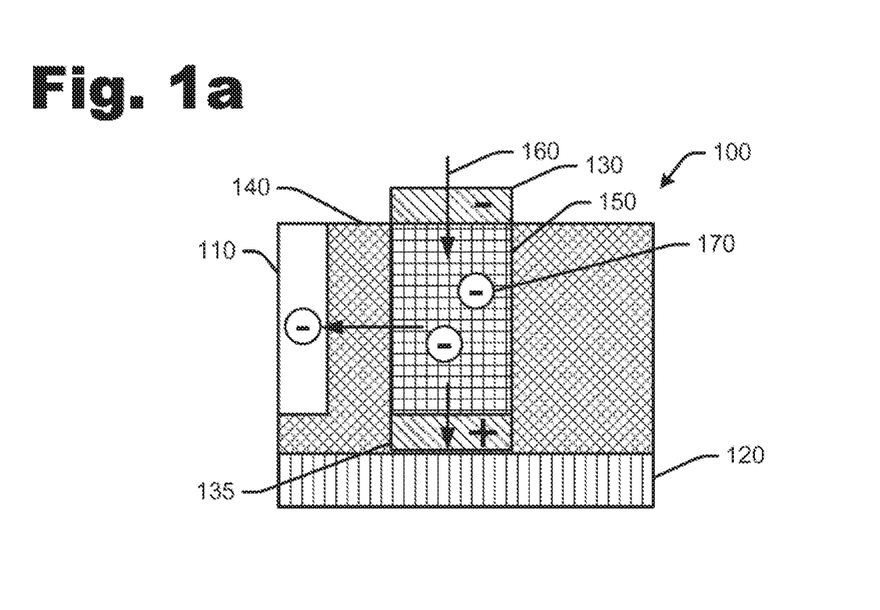
FIGS. 1a-d illustrate device structures of an example charge trapping memristor having a charge trapping material.
Figure 1B:
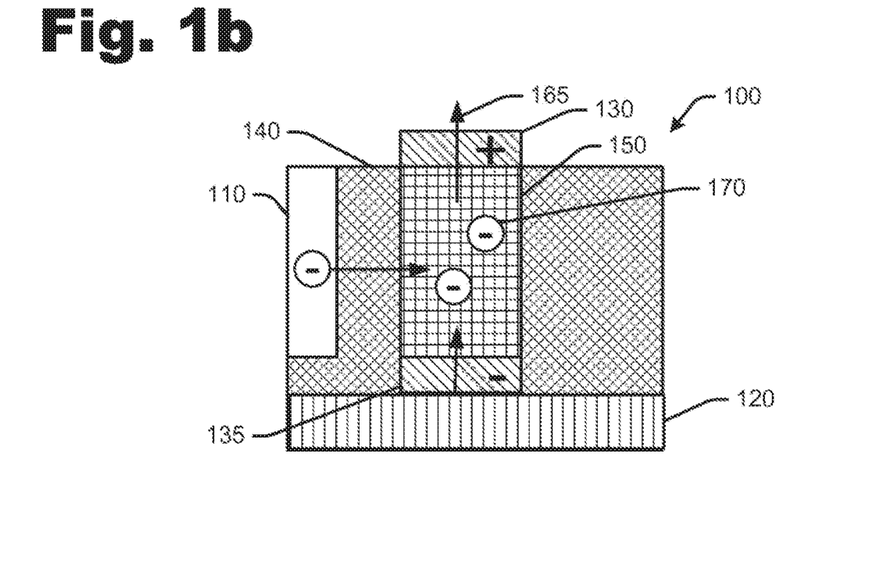
Figure 1C:
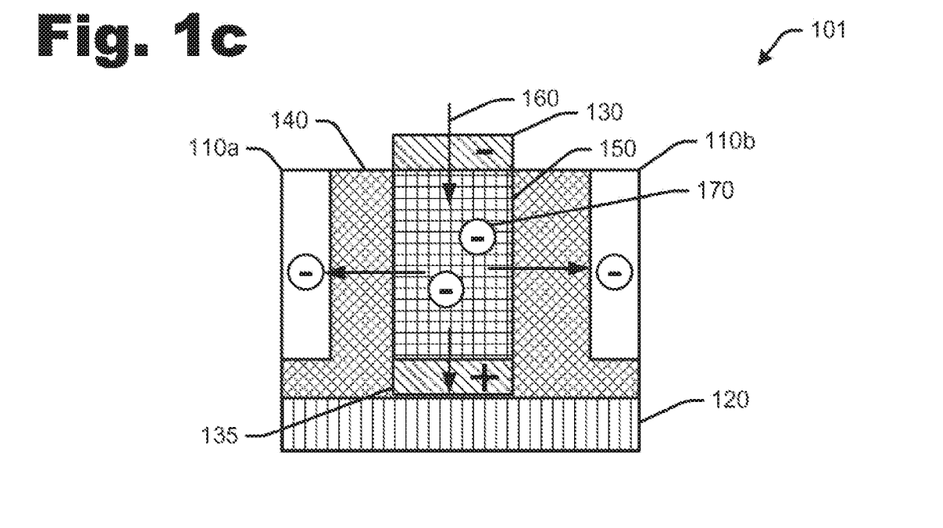
Figure 1D:
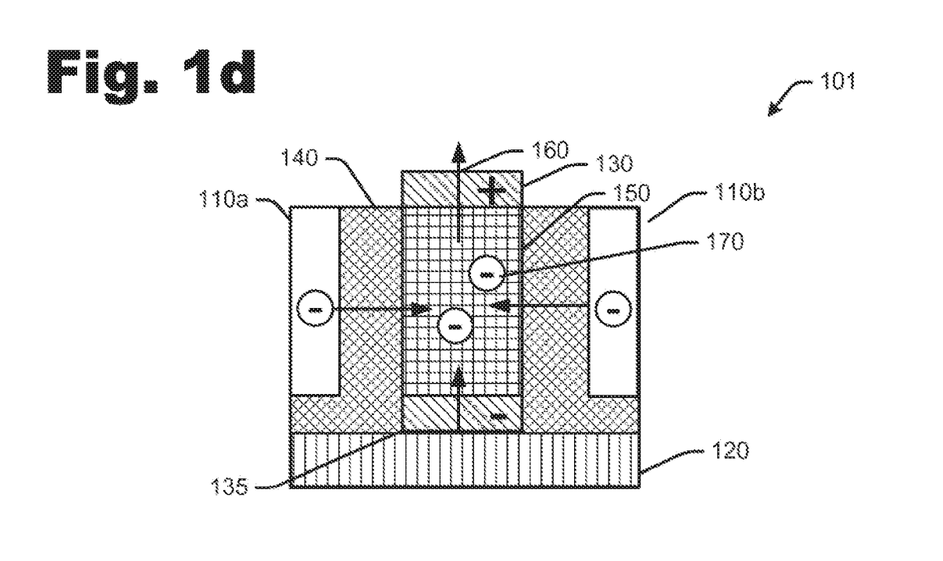

In FIGS. 1a-b, the device structure is illustrated having one charge trapping element 110. However, the device structure is not limited to such a configuration. For example, the device structure may include multiple charge trapping elements. By way of non-limiting illustration, FIGS. 1c-d show another charge trapping memristor 101 having charge trapping elements 110a-b. Although the following discussion is primarily with reference to the charge trapping memristor 100 shown in FIGS. 1a-b, it should be understood that a similar discussion also applies to the device structure of charge trapping memristor 101 shown in FIGS. 1c-d, without need to repeat the same herein.

In an example, the charge trapping memristor 100 is fabricated on top of or by cutting a trench into the substrate 120, such as silicon where the device is to be fabricated. By deposition or implant doping, a "bottom" metal or degenerately doped electrode 135 is formed to inject or remove charges from the channel 150. The channel 150 is fabricated by additive deposition of a material such as tantalum oxide, hafnium oxide, titanium oxide, or other metal oxides on the second electrode 135. Then an insulating charge barrier 140 (e.g., silicon nitride, aluminum oxide, SiO2) is deposited or thermally grown on the sidewall. A top electrode 130 is fabricated on top of the channel 150 to complete the device structure. The channel 150 may also be fabricated by diffusively doping a sidewall of the trench formed in the substrate 120. This is followed by a charge trapping layer 110 (such as but not limited to silicon nitride or silicon rich SiO2). A top electrode 130 is fabricated on top of the channel 150 to complete the device.

It is noted that the terms "top" and "bottom" are used with reference to the deposition layers, with bottom layers being deposited first, and "top" layers being deposited over the "bottom" layers. While these terms are illustrative with reference to the figures, and may be useful during fabrication, the terms "top" and "bottom" are not intended to be limiting of the device structure in any manner.

It is noted that any suitable fabrication processes may be implemented to manufacture the charge trapping memristor 100. For example, fabrication techniques may be similar to those used to produce titanium dioxide memristors, ferroelectric memristor, spin-transfer torque magnetoresistance devices, spin memristive systems, and/or other techniques now known or later developed.

In an example, the fabrication can proceed at lower temperatures than conventional memory systems fabrication. For example, the charge trapping memristor 100 may be fabricated at temperatures less than 800-900° C., and in another example at temperatures of about 300-400° C.). These lower temperatures enable the charge trapping memristor 100 to be fabricated over CMOS, control/drive electronics, and/or other circuitry, without damaging the underlying circuitry. As such, the charge trapping memristor 100 may have a device structure implemented in an additive (e.g., stacked and/or side-by-side) configuration. Such a configuration enables multiple memory elements to be fabricated together, increasing memory density, and decreasing the device footprint and associated cost.

To understand operation of the device structure shown in FIGS. 1a-b, it is helpful to first explain the fundamental properties of memristance. If charge flows in one direction (e.g., as illustrated by arrows 160 in FIGS. 1a and 1c) through the device structure, the resistance of the circuit increases. If charge flows in the opposite direction (e.g., as illustrated by arrows 165 in FIGS. 1b and 1d) in the circuit, the resistance decreases.

A common analogy in electronics for a capacitor is to think of it as a bucket that stores water (i.e., the water is analogous to electrical charge). Likewise, an analogy for a resistor is to think of it as a pipe that carries water. Again, the water is analogous to electrical charge. But for a resistor, the pressure at the input of the pipe behaves similar to voltage, and the rate of flow of the water through the pipe behaves similar to electrical current. The flow of water through the pipe is faster if the pipe is shorter and/or has a larger diameter; just as with the resistor.

A similar analogy can be made for a memristor. But instead of the pipe having a fixed diameter (i.e., like the resistor in the above analogy has a fixed resistance), a memristor can be described as a type of pipe that expands or shrinks when water flows through it. If water flows through the pipe in one direction, the diameter of the pipe increases, thus enabling the water to flow faster. If water flows through the pipe in the opposite direction, the diameter of the pipe decreases, thus slowing down the flow of water. If the water pressure is turned off, the pipe will retain its most recent diameter until the water is turned back on. Thus, the pipe does not store water like a bucket (analogous to a capacitor), instead, the memristor remembers how much water (analogous to electric charge) flowed through it.

The direction of charge flowing through the device structure is based on polarity of an electric potential across the channel 150 (e.g., a voltage applied to the electrodes 130, 135). For example, in FIG. 1a, a voltage is applied to the top (e.g., negative) terminal 130, causing charge carriers 170 (e.g., electrons) to flow toward the bottom (e.g., positive) terminal 135. In FIG. 1b, the polarity is reversed. That is, the voltage is applied to the bottom (e.g., negative) terminal 135, causing charge carriers 170 (e.g., electrons) to flow toward the top (e.g., positive) terminal 130.

It is noted that the charge trapping memristor 100 is said to have a regime of operation with an approximately linear charge-resistance relationship, as long as the time-integral of the current stays within certain bounds. That is, memristor resistance depends on the integral of the input applied to the terminals (rather than on the instantaneous value of the input, as in a varistor).

If the flow of charge carriers 170 is stopped (e.g., by turning off the applied voltage), the memristor device 100 will 'remember' the last resistance of the circuit (e.g., a high resistance or a low resistance). When the flow of charge carriers 170 starts again (e.g., by turning on the applied voltage), the resistance of the circuit will be what it was when last active (e.g., the circuit will be in a high resistance state or a low resistance state). This resistance can be correlated, in terms of computer memory, to a high (or "1") or a low (or "0") memory state. Accordingly, the device structure can be used to retain bit values. Multiple devices may be implemented (e.g., as an array) to retain multiple bits or bytes in a memory.

Application of the charge trapping material 110 in memory systems may include, by way of non-limiting illustration, a type of non-volatile random access memory (NVRAM). Such a memory has very useful properties, in that it would not 'forget' the data that it stores when power is turned off. NVRAM implementing the charge trapping material 110 may be a strong competitor in the flash memory market. That is, there is a need for fast, dense, nonvolatile, low energy, memory capable of many (e.g., millions or even more) read-write cycles.

It is noted that dynamic and static random access memory (RAM) are volatile, not very dense, and consume significant energy. Flash memory is slow, energy intensive, and provides only thousands of read-write cycles. Resistive RAM (ReRAM) based on a cross bar of memristors promises to provide memory with the desired characteristics. But the existing memristors are based on ion motion to alter the electron conduction and/or tunneling in a two-terminal device. These electronic properties depend exponentially on barrier height, thickness, and defect density, and so it is very hard to control the variation to achieve desired levels of control for gigabit sized memories. In addition, existing memristors require new material sets not usually found in typical CMOS chips.

In contrast, the charge trapping memristor 100 disclosed herein can be implemented as a fast, efficient, and low energy memory device. The charge trapping memristor 100 may also be provided with the self-limiting charging property of flash, as discussed in more detail below, thereby reducing device variability. In addition, the charge trapping memristor 100 can be fabricated as part of an additive configuration (e.g., with multiple memory elements to be fabricated together), increasing memory density, and decreasing the device footprint and associated cost.

The charge trapping memristor 100 may also be fabricated using techniques already developed for manufacturing flash memory. As noted above, the various metal oxides that have been identified as having a memory function are also suitable for use in fabricating the charge trapping material 110, and are also highly compatible with present chip fabrication facilities. For example, many of the materials and processing facilities are similar and/or the same as those used to fabricate CMOS and flash memory devices. As such, the charge trapping material 110 can be made in existing foundries with few, if any changes.

FIGS. 2a-d illustrate device structures of another example charge trapping memristor 200 having a charge trapping material 210 and a field assistance electrode 237. It is noted that 200-series reference numbers are used in FIGS. 2a-d to refer to similar components as already described above for FIGS. 1a-d. That is, an example device structure of the charge trapping memristor 200 shown in FIGS. 2a-b includes a substrate 220, a first electrode 230, a second electrode 235, an insulator 240, and a channel 250 formed between the first and second electrodes.

Figure 2A:
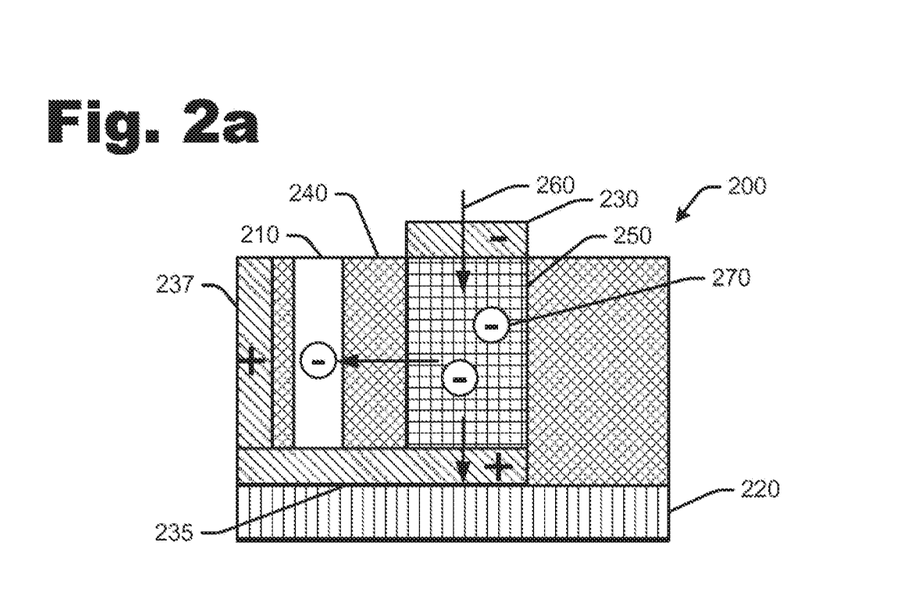
FIGS. 2a-d illustrate device structures of another example charge trapping memristor having a charge trapping material and a field assistance electrode.
Figure 2B:
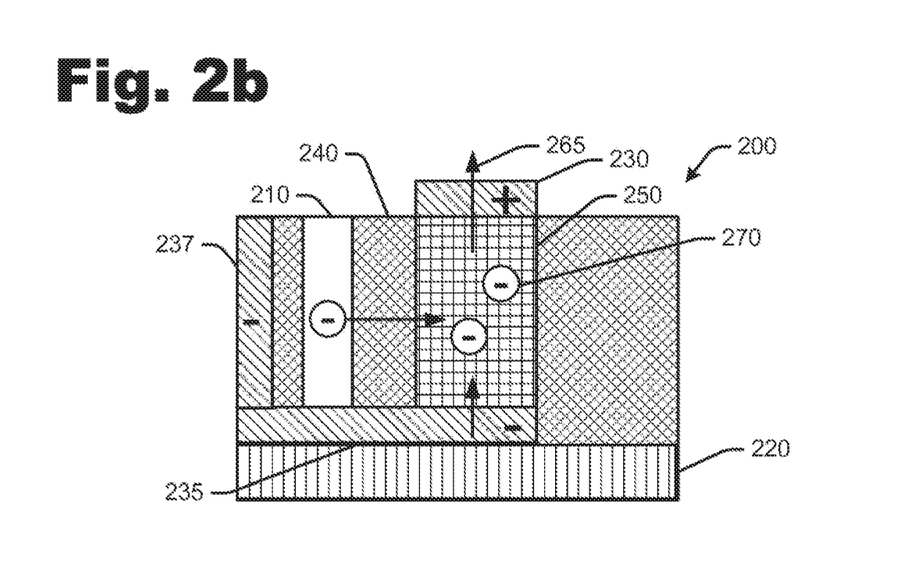

In an example, the charge trapping memristor 200 is fabricated on or by cutting a trench into the substrate 220, such as silicon, where the device is to be fabricated. By deposition or implant doping, a "bottom" metal or degenerately doped electrode 235 is formed to inject or remove charges from the channel 250. A further deposited dielectric and metal are used to form the field assistance electrode 237.

It is noted that the field assistance electrode 237 is not a "third" electrode. Instead, the field assistance electrode 237 may be provided as an extension of the bottom electrode 235. In another example, the field assistance electrode may be provided as an extension of the top electrode 230.

Fabrication then proceeds similar to that described above for the device structure in FIGS. 1a-d. That is, the channel 250 is fabricated by additive deposition or created by diffusively doping a sidewall of the trench formed in the substrate 220. Then an insulating charge barrier 240 (such as but not limited to $SiO_2$) is deposited or thermally grown on the sidewall. This is followed by a charge trapping layer 210 (such as but not limited to silicon nitride or silicon rich $SiO_2$). A top electrode 230 is fabricated on top of the channel to complete the device.

It should be understood that a similar discussion of operation of the charge trapping memristors 100 and 101 also applies to the device structure of charge trapping memristors 200 and 201 shown in FIGS. 2a-d, without need to repeat the same herein.

With regard to the charge trapping memristors 200 and 201 shown in FIGS. 2a-d, the field assistance electrode 237 may be implemented as an "accelerating" electrode. A charge applied to the field assistance electrode 237 accelerates charge injection and/or removal of charge. That is, applying a charge to the field assistance electrode 237 causes more charge carriers 270 to cross or "jump" over the insulator 240 between channel 250 and be trapped by the charge trapping element 210.

In an example, when a positive charge is applied to the field assistance electrode 237, more charge carriers 270 are collected in the charge trapping element 210. When a negative charge is applied to the field assistance electrode 237, more charge carriers 270 are returned to the channel 250 from the charge trapping element 210.

It is noted that the electric field can also be enhanced in the channel and/or channel region by appropriate doping of the channel and/or other components of the device structure.

Figure 2C:
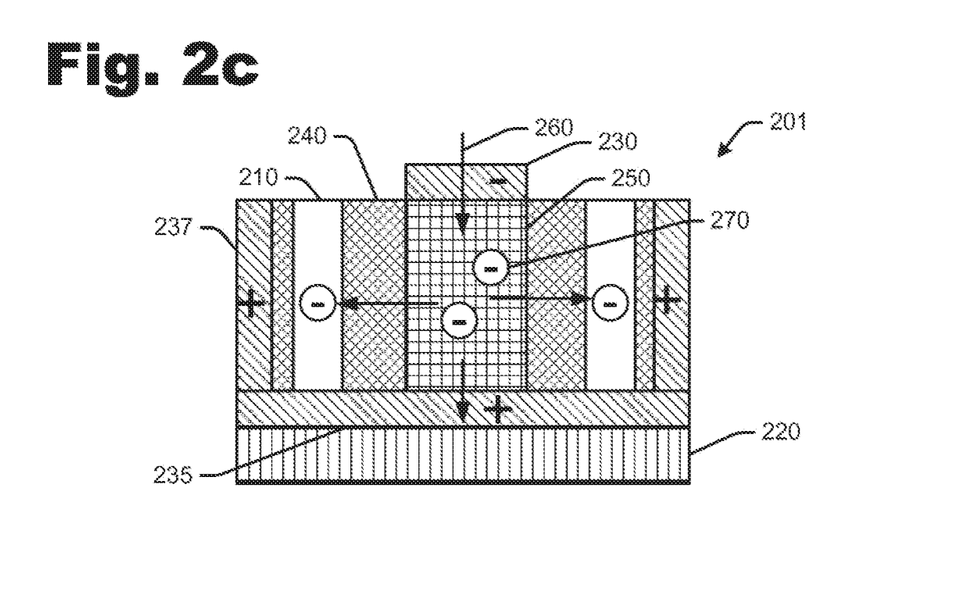
Figure 2D:
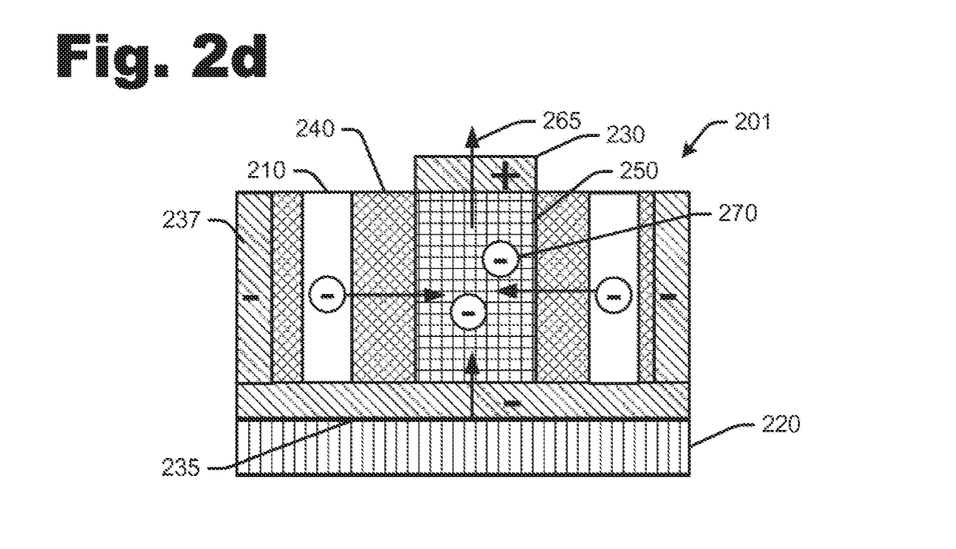

Again, the device structure 200 in FIGS. 2a-b is illustrated having one charge trapping element 210. However, the device structure is not limited to such a configuration. For example, the device structure may include multiple charge trapping elements. By way of non-limiting illustration, FIGS. 2c-d show a charge trapping memristor 201 having charge trapping elements 210a-b. Likewise, field assistance electrodes 237a-b are illustrated in the example shown in FIGS. 2c-d.

Although the above discussion is primarily with reference to the charge trapping memristor 200 shown in FIGS. 1a-b, it should be understood that a similar discussion also applies to the device structure of charge trapping memristor 201 shown in FIGS. 2c-d, without need to repeat the same herein.

Figure 3A:
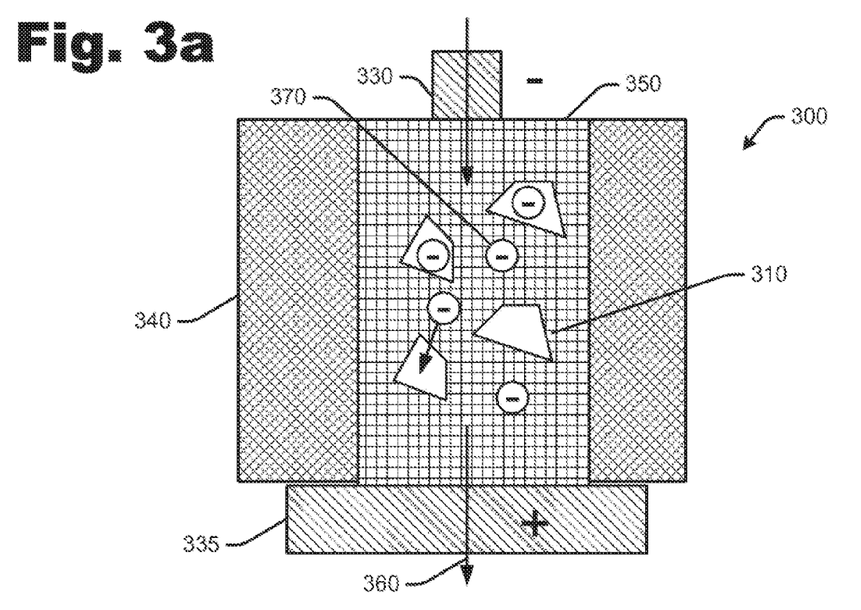
FIGS. 3a-b illustrate device structures of another example charge trapping memristor, wherein the charge trapping material is an inclusion.
Figure 3B:
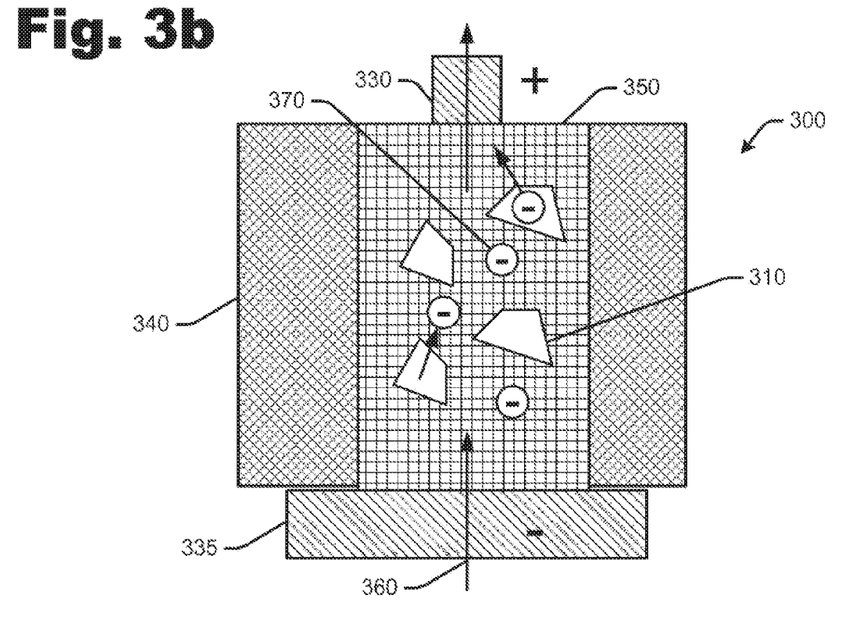

FIGS. 3a-b illustrate device structures of another example charge trapping memristor 300, wherein at least a portion of charge trapping material 310 is an inclusion (or more than one inclusion as illustrated). The example illustrated in FIGS. 3a-b may also be implemented with the device structure of FIGS. 1a-d and 2a-d, e.g., in a channel including barrier(s), charge trapping element(s), and/or field assistance electrode(s) (not shown in FIGS. 3a-b to simplify the drawing); wherein the inclusion(s) are incorporated into the channel portion of the device structure. It is noted that 300-series reference numbers are used in FIGS. 3a-b to refer to similar components as already described above for FIGS. 1a-d. That is, an example device structure of the charge trapping memristor 300 shown in FIGS. 3a-b includes a substrate 320, a first electrode 330, a second electrode 335, an insulator 340, and a channel 350 formed between the first and second electrodes.

In an example, the charge trapping memristor 300 is fabricated similar to that described above for the device structure in FIGS. 1a-d and/or FIGS. 2a-d, but without the separate charge trapping elements 110 and 210 shown in these figures. Instead, the charge trapping element 310 is incorporated into the channel 350 itself.

In an example, the charge trapping memristor 300 is fabricated on top of or by cutting a trench cut into the substrate 320, such as silicon where the device is to be fabricated. By deposition or implant doping, a "bottom" metal or degenerately doped electrode 335 is formed to inject or remove charges from the channel 350. A field assistance electrode (not shown) may also be provided. The channel 350 is fabricated by additive deposition or formed by diffusively doping a sidewall of the trench formed in the substrate 320. Fabrication continues by depositing or thermally growing an insulating charge barrier 340 (such as but not limited to $SiO_2$) on the sidewall. A top electrode 330 is fabricated on top of the channel to complete the device.

As mentioned above, fabrication of the channel 350 includes incorporating a charge trapping material 310 as inclusions in the channel 350. Charge trapping material 310 may include, but is not limited to silicon nitride or silicon rich $SiO_2$. In an example, the channel 350 is comprised of a semiconductor (e.g., silicon) and insulating inclusions (e.g., $SiO_2$) and/or other components so that the channel 350 is non-homogenous. The channel 350 can be formed with the inclusions, such as by precipitating and/or phase separating the "impurities" (e.g., silicon rich oxide) or other similar material techniques.

During operation, when current flows past the inclusions, hot charge carriers 370 surmount the barrier posed by the inclusions 310 and become trapped in the channel 350 within the inclusions 310. The charge provided by these "trapped" charge carriers alters the electrical properties of the conducting channel 350 by pinching off the transport of charge carriers. By injecting and accelerating the opposite charge carriers (e.g., positive or negative charge from the electrodes) into the channel 350, the charge within the inclusions 310 is neutralized, thereby increasing conduction of the channel 350 for the charge carriers 370.

It should be understood that a similar discussion of operation of the charge trapping memristors 100 and 101 also applies to the device structure of charge trapping memristors 300 and 301 shown in FIGS. 3a-d, without need to repeat the same herein.

Operation of the various device structures can be understood by studying the corresponding band diagrams. A band diagram plots key electron energy levels (Fermi level and nearby band edges) as a function of a spatial dimension. Band diagrams help to visualize band bending during the operation of semiconductor devices. For purposes of illustration, band diagrams are only shown for the device structures in FIGS. 1c-d and 2c-d, although it is understood that similar band diagrams can be readily generated for the other device structures by those having ordinary skill in the art after reading and understanding the disclosure presented herein.

Figure 4A:
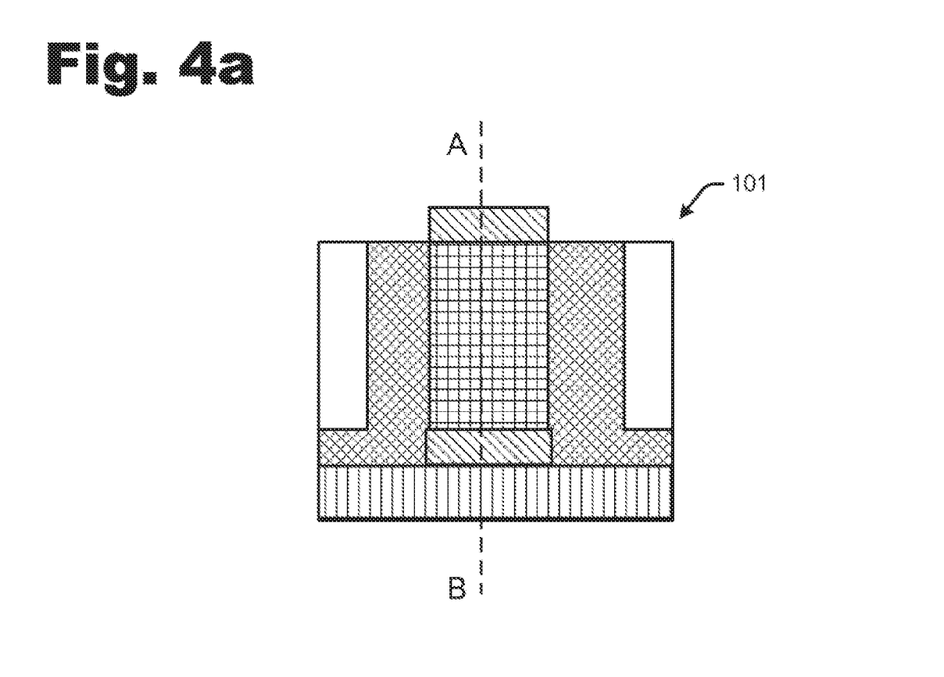
FIG. 4a illustrates an example device structure corresponding to FIGS. 1c-d.
Figure 4B:
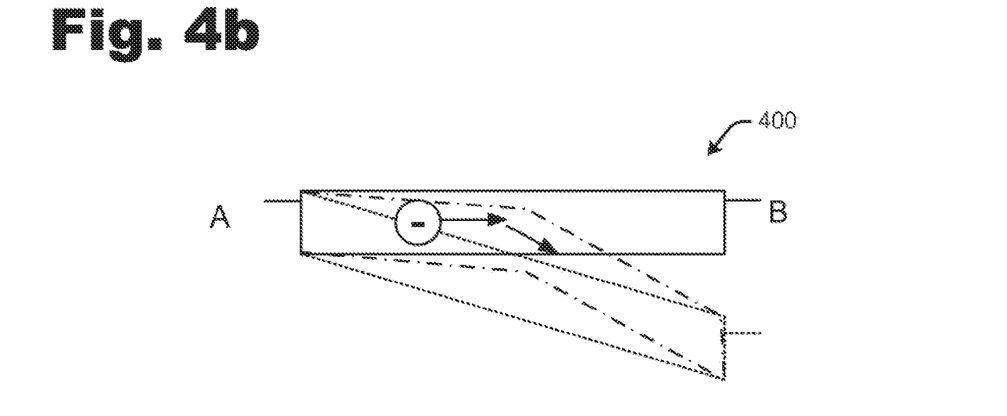
Figure 4C:
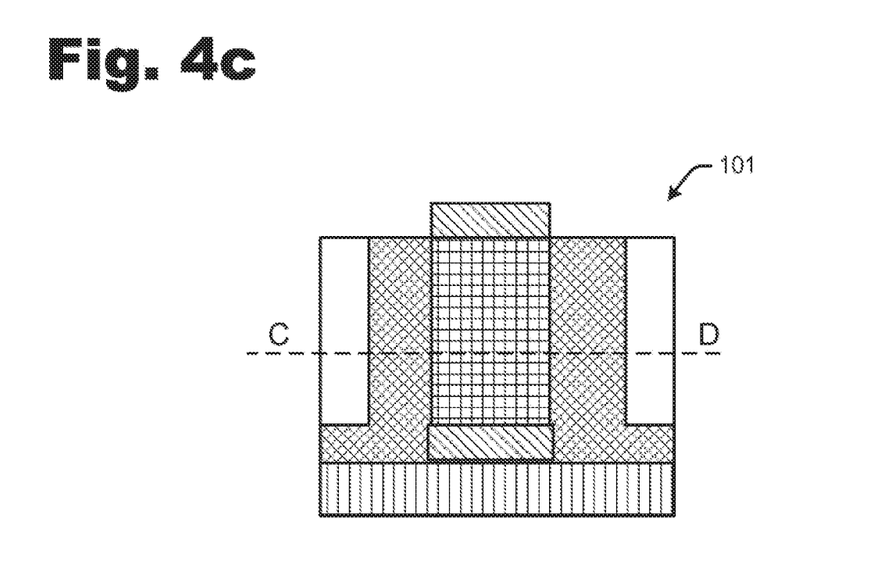
FIG. 4c illustrates an example device structure corresponding to FIGS. c-d.

FIG. 4a illustrates an example device structure 101 corresponding to FIGS. 1c-d; and FIG. 4b illustrates the corresponding band diagram 400 taken along lines AB in FIG. 4a. FIG. 4c again illustrates the example device structure 101; and FIG. 4d iilustrates the corresponding band diagram 405 taken along lines CD in FIG. 4c. FIG. 5a illustrates an example device structure 201 corresponding to FIGS. 2c-d (having a field assistance eiectrode); and FIG. 5b illustrates the corresponding band diagram 500 taken along lines AB in FIG. 5a. FIG. 5c again illustrates the example device structure 201 corresponding to FIGS. 2c-d; and FIG. 5d illustrates the corresponding band diagram 505 taken along lines CD in FIG. 5c.

In FIGS. 4b, 4d, and 5b, 5d, the vertical axis of the band diagram represents the energy of an electron, which includes both kinetic and potential energy. The horizontal axis represents position (albeit, not to scale). In FIGS. 4b and 5b, the lines on each side of the diagram represents the charge trapping material being empty (above the lines), and filling with electrons (below the lines). In addition to showing electron energy levels, the band diagrams in FIGS. 4d and 5d further depict the position of the electrons in charge trapping material of the various device structures.

Figure 4D:
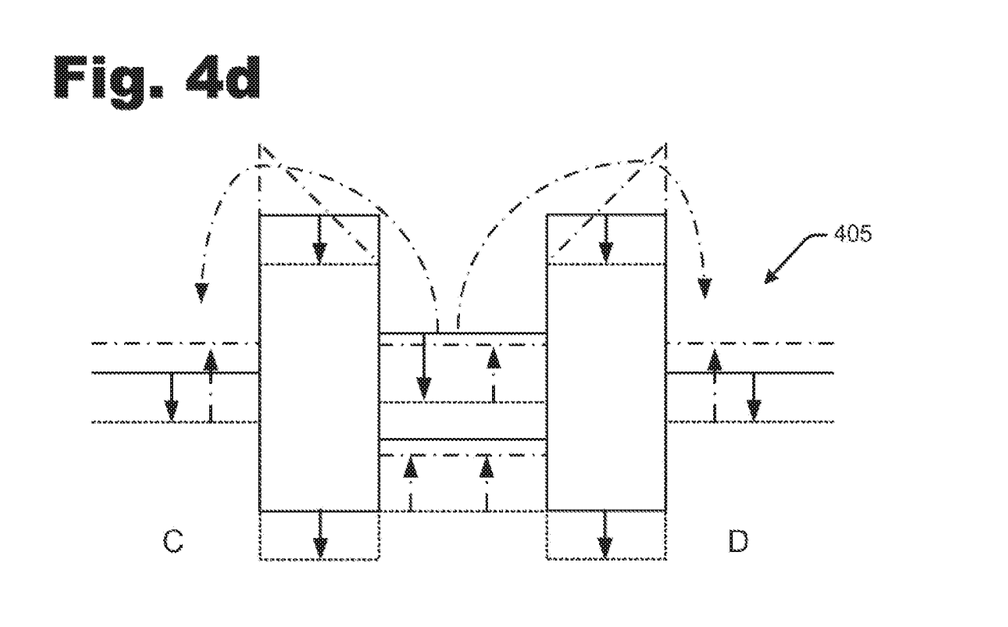
FIG. 4d illustrates the corresponding band diagram taken along lines CD in FIG. 4c.
Figure 5A:
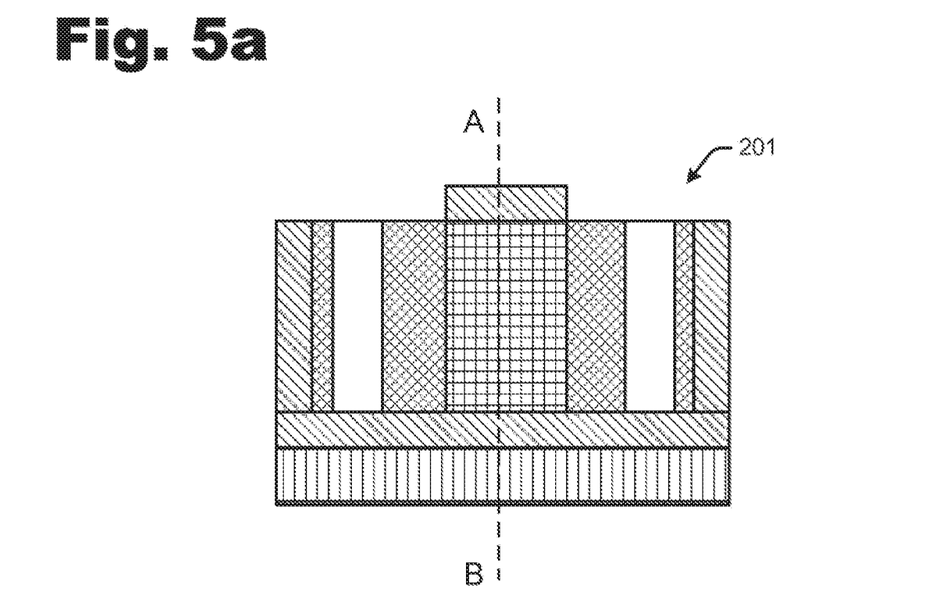
FIG. 5a illustrates an example device structure corresponding to FIGS. 2c-d.
Figure 5B:
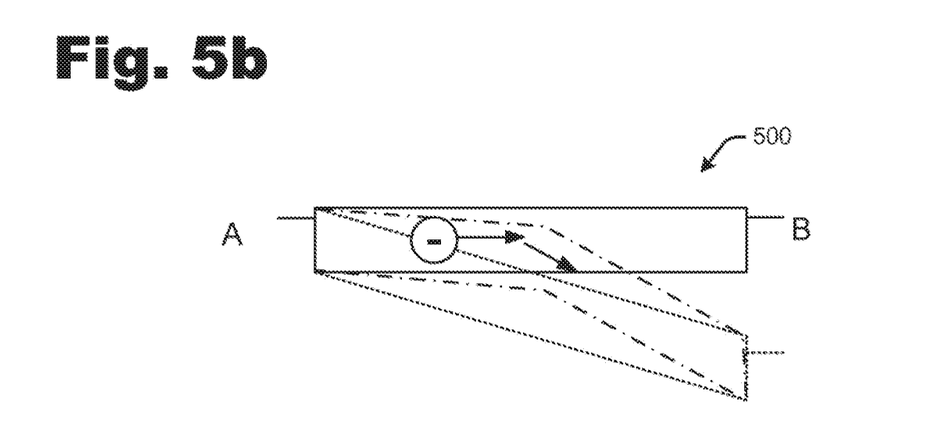
Figure 5C:
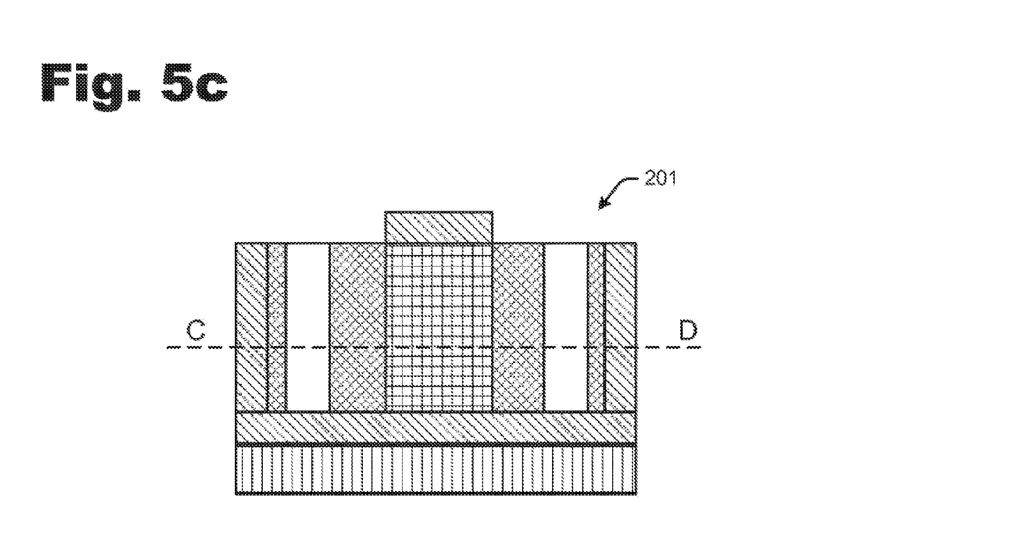
FIG. 5c illustrates the example device structure corresponding to FIGS. 2c-d.
Figure 5D:
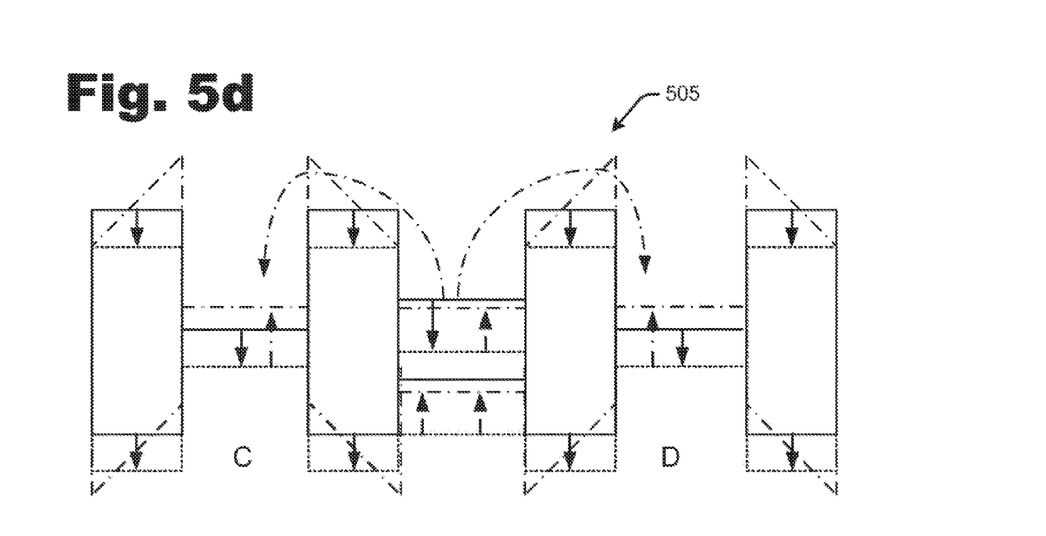
FIG. 5d illustrates the corresponding band diagram taken along lines CD in FIG. 5c.

In FIGS. 4d and 5d, it is noted that the solid lines denote the state of electrons at zero bias (e.g., before the bias is applied at time t=0). The dotted lines denote that the bias has been applied (e.g., at some time t=+0), but before the electrons have had a chance to trap. The dash-dotted lines denote that electrons have had a chance to trap and change the potential (e.g., at some later time t>>0).

With reference to the band diagrams shown in the drawings, it can be seen that the carriers are accelerated by the potential between the top and bottom electrodes. If the field is sufficiently large, the carriers heat up and are be to jump over the barrier into the charge trapping layer. The trapped charges change the electrical characteristics of the channel. That is, trapped negative charge impedes the conduction of electrons by raising the potentiai part way down the channel. Positive charge (or reduced negative charge) enhances the conduction of electrons in the channel by lowering the mid-channel potential.

It is noted that the device structures exhibit characteristic behavior of a memristor. That is, the state variable (w) is the charge in the charge trapping material, and changes according to the defining equations for the memristive state. That is, the amount of trapped charge increases as a function of the current (f(w,l,t)), where l is the integrated current and t is time. If f(w,l,t)=l, then w is proportional to the integrated current, or current flux passing through the device, and the conductance depends on the trapped charge, w.

Unlike traditional memristors, the memristor memory disclosed herein does not rely solely on the motion of ions, instead, operation of the memristor memory is based at least in part on trapping and releasing charge carriers. Hence, the memristor memory can operate faster, consuming less energy, and may also exhibit a greater resilience over time. It is noted that the trapping of charge may also serve to "self-limit" (e.g., based on the applied voltage) charge retained in the channel. That is, if one (or some) memristor elements in a memory array charge faster (or slower than other memristor eiements in the array, all of the memristor elements will still reach the same field potential over time as the trapped charge continues to change (at least until the field reaches a steady state).

Before continuing, it should be noted that the examples described above are provided for purposes of illustration, and are not intended to be limiting. Other devices and/or device configurations may be implemented.

Figure 6:
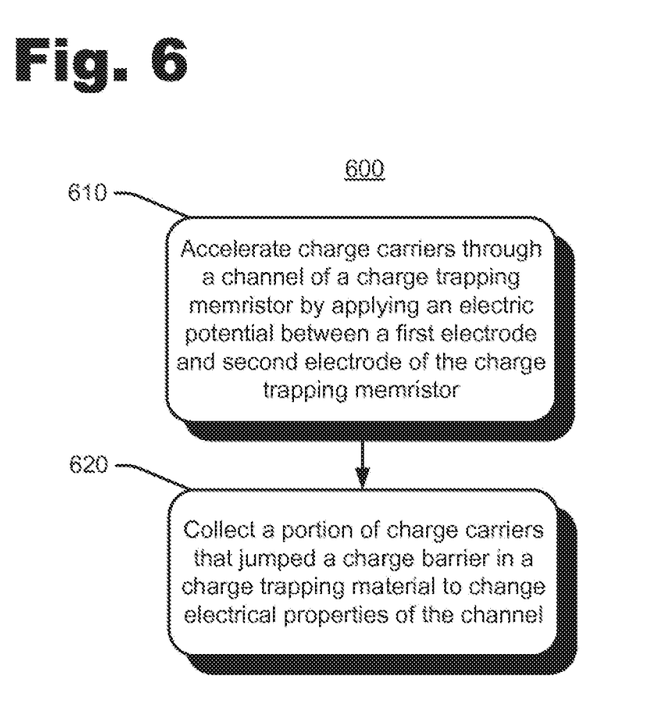
FIGS. 6-7 are flowcharts illustrating example operations which may be implemented by a charge trapping memristor.
Figure 7:
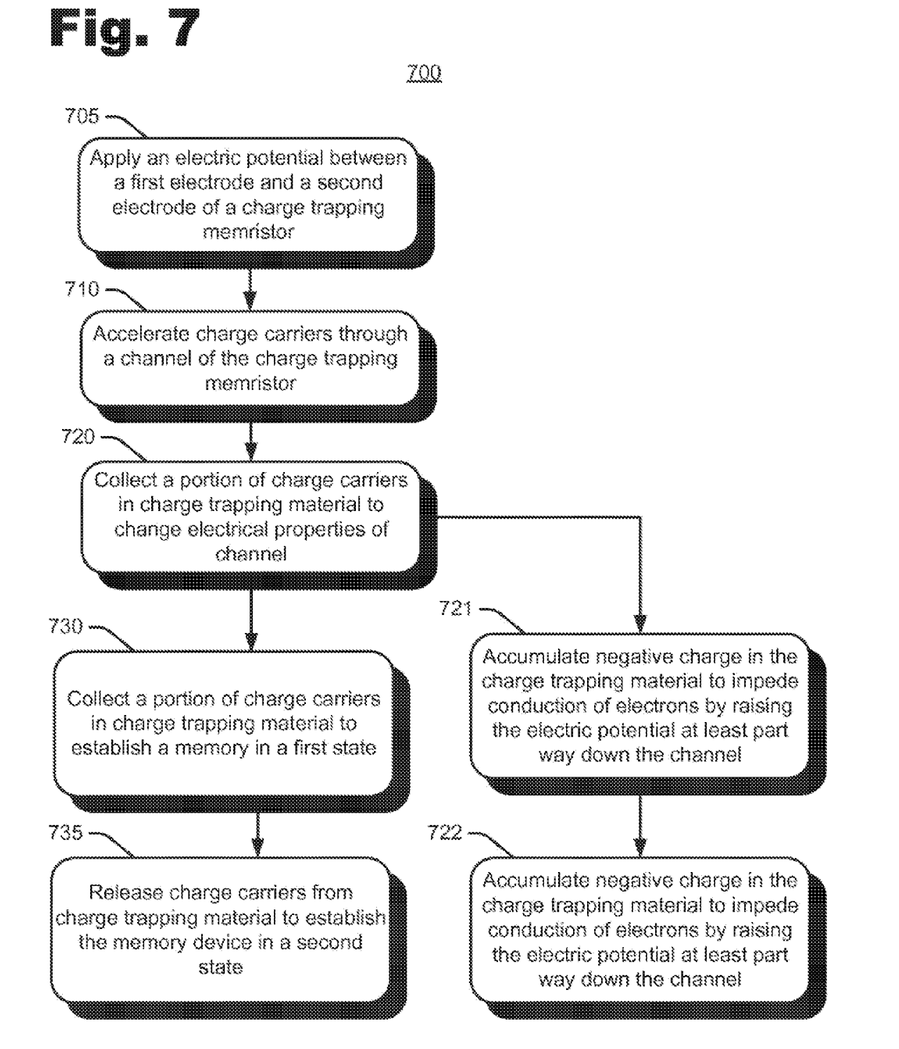

FIGS. 6-7 are flowcharts illustrating example operations which may be implemented by a charge trapping memristor. The operations 600 and 700 may be implemented by any of the device structures described herein, and/or by variations thereof, as will be readily understood by those having ordinary skiil in the art after reading and understanding the disclosure presented herein.

In the example shown in FIG. 6, operation 610 includes accelerating charge carriers through a channel of a charge trapping memristor, e.g., by applying an electric potential between a first electrode and second electrode of the charge trapping memristor. Operation 620 includes collecting a portion of the charge carriers that jumped a charge barrier in a charge trapping material to change electrical properties of the channel.

In the example shown in FIG. 7, operation 710 includes accelerating charge carriers through a channel of a charge trapping memristor. For example, accelerating is illustrated in operation 706 as it may be achieved by applying an electric potential between a first electrode and second electrode of the charge trapping memristor. Operation 720 includes collecting a portion of the charge carriers in a charge trapping material to change electrical properties of the channel. In an example, an accumulated negative charge in the charge trapping material impedes conduction of electrons by raising the electric potential at least part way down the channel, as illustrated by block 721. Also in an example, an accumulated positive charge in the charge trapping material enhances conduction of electrons in the channel by lowering mid-channel potential, as illustrated by block 722. It is noted that other mechanisms for electron transport are also contemplated. In an example, a dominant current is carried by "holes." As the holes become trapped, these trapped holes impede the flow of other holes through the device structure. As such, the trapped electrons (i.e., the electrons in the holes that have been trapped) enhance conduction of the trapped holes.

In an example, wherein the charge trapping memristor is implemented in a memory device, operation 730 includes collecting a portion of the charge carriers in the charge trapping material establishes a memory device in a first state. Operation 735 includes releasing the charge carriers from the charge trapping material to establish the memory device in a second state.

The operations shown and described herein are provided to illustrate example implementations, it is noted that the operations are not limited to the ordering shown. Still other operations may also be implemented. By way of non-limiting example, further operations may include an accelerating electrode attracting the heated charge carriers into the trapping material.

It is noted that the examples shown and described are provided for purposes of illustration and are not intended to be limiting. Still other examples are also contemplated.

The invention claimed is:

1. A charge trapping memristor, comprising:
   a first electrode and a second electrode configured on opposite sides of a channel to generate an electric potential across the channel;
   a charge trapping material to store and release an electric charge therein, wherein storing and releasing the electric charge changes electrical properties of the channel; and
   an insulating charge barrier between the channel and the charge trapping material.

2. The charge trapping memristor of claim 1, wherein the charge trapping material is between adjacent layers of the insulating charge barrier.

3. The charge trapping memristor of claim 1, further comprising a field assistance electrode.

4. The charge trapping memristor of claim 1, wherein the charge trapping material is an inclusion in the channel.

5. The charge trapping memristor of claim 4, wherein the inclusion is at least one of: a semiconductor material, metal within a wide band semiconductor material, and an insulating material.

6. The charge trapping memristor of claim 1, wherein the channel is doped to enhance current between the first and second electrodes.

7. The charge trapping memristor of claim 1, wherein a negative charge in the charge trapping material impedes conduction of electrons by raising the electric potential in the channel, and a positive charge in the charge trapping material enhances conduction of electrons in the channel by lowering the electric potential in the channel.

8. A method comprising:
   accelerating charge carriers through a channel of a charge trapping memristor by applying an electric potential between a first electrode and second electrode of the charge trapping memristor; and
   collecting a portion of the charge carriers that jumped a charge barrier in a charge trapping material to change electrical properties of the channel, the charge barrier insulating the channel from the charge trapping material.

9. The method of claim 8, wherein collecting a portion of the charge carriers in the charge trapping material establishes a memory device in a first state.

10. The method of claim 9, further comprising releasing the charge carriers from the charge trapping material to establish the memory device in a second state.

11. The method of claim 8, wherein a dominant current is carried by holes, and holes that are trapped impede other holes, and trapped electrons enhance hole conduction.

12. The method of claim 8, wherein an accumulated charge in the charge trapping material impedes conduction of electrons by raising the electric potential at least part way down the channel.

13. The method of claim 8, wherein an accumulated charge in the charge trapping material enhances conduction of electrons in the channel by lowering mid-channel potential.

14. The method of claim 8, further comprising an accelerating electrode attracting the heated charge carriers into the trapping material.

15. The charge trapping memristor of claim 1, wherein the charge trapping material is included in a first charge trapping element, the charge trapping memristor comprising:

a second charge trapping material included in a second charge trapping element separate from the first charge trapping element.

16. The charge trapping memristor of claim 15, wherein the first change trapping element and the second charge trapping element are on opposite sides of the channel.

17. The charge trapping memristor of claim 16, wherein the first charge trapping element and the second charge trapping element are separated from the channel by the charge barrier.

\* \* \* \* \*